United States Patent
Jou et al.

(10) Patent No.: US 7,881,256 B2
(45) Date of Patent: Feb. 1, 2011

(54) MOBILE STATION SUPERVISION OF THE FORWARD DEDICATED CONTROL CHANNEL WHEN IN THE DISCONTINUOUS TRANSMISSION MODE

(75) Inventors: Yu-Cheun Jou, San Diego, CA (US); Edward G. Tiedemann, Jr., San Diego, CA (US)

(73) Assignee: Qualcomm, Incorporated, San Diego, CA (US)

( * ) Notice: Subject to any disclaimer, the term of this patent is extended or adjusted under 35 U.S.C. 154(b) by 1343 days.

(21) Appl. No.: 10/162,514

(22) Filed: Jun. 3, 2002

(65) Prior Publication Data

US 2002/0150069 A1   Oct. 17, 2002

Related U.S. Application Data

(63) Continuation of application No. 09/358,634, filed on Jul. 21, 1999, now Pat. No. 6,480,472.

(51) Int. Cl.
H04W 4/00 (2009.01)
H04B 7/216 (2006.01)
H04B 7/004 (2006.01)

(52) U.S. Cl. .................. 370/329; 370/335; 370/342; 455/515

(58) Field of Classification Search ............ 370/252, 370/342, 437, 335, 524, 229, 235, 329, 341; 455/515, 517
See application file for complete search history.

(56) References Cited

U.S. PATENT DOCUMENTS 4,862,453 A * 8/1989 West et al. .................. 370/314
4,901,307 A 2/1990 Gilhousen et al. ........... 370/320

(Continued)

FOREIGN PATENT DOCUMENTS

EP    0532485    3/1993

(Continued)

OTHER PUBLICATIONS

Dahlman, et al. "UMTS/IMT-2000 Based on Wideband CDMA" IEEE Communications Magazine 36(9): 70-80 (1998).

(Continued)

*Primary Examiner*—Pankaj Kumar
*Assistant Examiner*—Saba Tsegaye
(74) *Attorney, Agent, or Firm*—Kent D. Baker; Howard H. Seo

(57) ABSTRACT

A method and apparatus for supervising a dedicated control channel when in the discontinuous transmission mode. The mobile station monitors the frames it receives from a base station and maintains a counter of bad, good, and empty frames, referred to as CNT1, CNT2, CNT3, respectively. If a received frame is a good frame, CNT1 is reset to zero and CNT2 is incremented. If the received frame is a bad frame, CNT1 is incremented and CNT2 is reset to zero. If the received frame is an empty frame, CNT1 and CNT2 are unchanged but CNT3 is incremented. A transmitter coupled to the mobile station is enabled or disabled depending upon which, if any, of the CNTs reaches or exceeds a designated threshold value. In another embodiment, an average aggregated value reflecting the strength of the pilot signals in an active set, measured at the mobile station, is used for comparison to a threshold.

25 Claims, 3 Drawing Sheets

U.S. PATENT DOCUMENTS

| | | | |
|---|---|---|---|
| 4,972,506 A * | 11/1990 | Uddenfeldt | 370/337 |
| 4,996,715 A * | 2/1991 | Marui et al. | 455/421 |
| 5,056,109 A | 10/1991 | Gilhousen et al. | |
| 5,101,501 A | 3/1992 | Gilhousen et al. | 455/442 |
| 5,103,459 A | 4/1992 | Gilhousen et al. | |
| 5,109,390 A | 4/1992 | Gilhousen et al. | 370/335 |
| 5,333,153 A * | 7/1994 | Brown et al. | 375/351 |
| 5,386,589 A * | 1/1995 | Kanai | 455/423 |
| 5,444,862 A * | 8/1995 | Hibino | 455/504 |
| 5,499,246 A | 3/1996 | Cooper | |
| 5,506,865 A | 4/1996 | Weaver, Jr. | 370/335 |
| 5,517,675 A | 5/1996 | O'Connor et al. | |
| 5,535,429 A | 7/1996 | Bergenlid et al. | 455/507 |
| 5,687,184 A * | 11/1997 | Lorenz et al. | 714/704 |
| 5,734,646 A | 3/1998 | Manalapan et al. | |
| 5,737,695 A * | 4/1998 | Lagerqvist et al. | 455/79 |
| 5,815,507 A * | 9/1998 | Vinggaard et al. | 714/704 |
| 5,872,775 A | 2/1999 | Saints et al. | |
| 5,884,187 A * | 3/1999 | Ziv et al. | 455/522 |
| 5,987,334 A * | 11/1999 | Kaku | 455/552.1 |
| 6,044,072 A * | 3/2000 | Ueda | 370/335 |
| 6,049,716 A * | 4/2000 | Jung | 455/442 |
| 6,073,021 A * | 6/2000 | Kumar et al. | 455/442 |
| 6,137,789 A | 10/2000 | Honkasalo | |
| 6,157,687 A | 12/2000 | Ono | |
| 6,337,984 B1 * | 1/2002 | Hong et al. | 455/439 |
| 6,353,602 B1 * | 3/2002 | Cheng et al. | 370/332 |
| 6,396,804 B2 | 5/2002 | Odenwalder | |
| 6,424,643 B1 * | 7/2002 | Gutowski | 370/342 |
| 6,766,173 B1 * | 7/2004 | Chun et al. | 455/450 |
| 2001/0041534 A1 * | 11/2001 | Roullet | 455/12.1 |
| 2002/0027890 A1 * | 3/2002 | Bernstein et al. | 370/331 |
| 2003/0017842 A1 * | 1/2003 | Moles et al. | 455/552 |

FOREIGN PATENT DOCUMENTS

| | | |
|---|---|---|
| EP | 0544101 A1 | 6/1993 |
| EP | 0599664 | 6/1994 |
| EP | 0651523 | 5/1995 |
| EP | 0645903 A | 3/2007 |
| GB | 2256351 A | 12/1992 |
| JP | 10-098448 | 4/1998 |
| JP | 2003-502938 | 1/2003 |
| WO | 9107020 | 5/1991 |
| WO | 9217954 | 10/1992 |
| WO | 9307702 | 4/1993 |
| WO | 9311627 | 6/1993 |
| WO | 9512297 | 5/1995 |
| WO | 9621987 | 7/1996 |
| WO | 9628809 | 9/1996 |
| WO | 9821909 | 5/1998 |
| WO | 9927745 | 6/1999 |

OTHER PUBLICATIONS

European Telecommunication Standard, ETS 300 580-4, Sep. 1994, Comfort noise aspect for full rate speech traffic channels (GSM 06.12), p. 7, last paragraph, p. 8, second and third paragraph, p. 9, last paragraph.

42th Vehicular Techonology Society Conference, May 10, 1992, Denver, US pp. 823-826 OSTLING 'Handover with Simulcasting' see the whole document.

European Search Report-EP04025741, Search Authority-The Hague-Jan. 11, 2005.

International Preliminary Examination Report-PCT/US00/019907, IPEA/US-May 30, 2001.

International Search Report-PCT/US00/019907, International Search Authority-European Patent Office-Oct. 17, 2000.

* cited by examiner

MOBILE STATION SUPERVISION OF THE FORWARD DEDICATED CONTROL CHANNEL WHEN IN THE DISCONTINUOUS TRANSMISSION MODE

CROSS REFERENCE

This continuation application claims priority from U.S. application Ser. No. 09/358,634, filed Jul. 21, 1999, now U.S. Pat. No. 6,480,472 entitled "Mobile Station Supervision of the Forward Dedicated Control Channel When in the Discontinuous Transmission Mode" and currently assigned to the assignee of the present invention.

BACKGROUND OF THE INVENTION

I. Field of the Invention

The present invention relates to communications. More particularly, the present invention relates to a method and apparatus for supervising a control channel used in a telecommunications system.

II. Description of the Related Art

The telecommunications Industry Association developed a standard for code division multiple access (CDMA) communications systems in the Interim Standard IS-95A, entitled "Mobile Station-Base Station Compatibility Standard for Dual-Mode Wideband Spread Spectrum Cellular System" (hereafter IS-95). In IS-95 systems, the mobile station controls the energy of its transmissions by means of a combination of open loop and closed loop power control methods. In open loop power control, a mobile station measures the received energy of the forward link signal from a serving base station and adjusts the energy of its reverse link transmission in accordance with this measurement. In closed loop power control, the serving base station measures the energy of transmissions from the mobile station and sends a series of up/down commands based on this measurement to the mobile station which adjusts its transmissions in response. A power control system employing closed loop and open loop power control is described in U.S. Pat. No. 5,056,109, entitled "METHOD AND APPARATUS FOR CONTROLLING TRANSMISSION POWER IN A CDMA CELLULAR MOBILE TELEPHONE SYSTEM," assigned to the assignee of the present invention and incorporated by reference herein.

In IS-95, the mobile station is required to monitor the Forward Traffic Channel performance during a call. When the mobile station receives twelve ($N_{2m}$) consecutive bad frames, the mobile station is required to disable its transmitter so that it will not jam the reverse link. Thereafter, if the mobile station receives two ($N_{3m}$) consecutive good frames, it should re-enable its transmitter. The mobile station also maintains a fade timer. The fade timer is first enabled when the mobile station enables its transmitter at the beginning of a call, and it is reset for five ($T_{5m}$) seconds whenever two ($N_{3m}$) consecutive good frames are received on the Forward Traffic Channel. If the fade timer expires, the mobile station disables its transmitter and declares a loss of the Forward Traffic Channel and terminates the call.

The International Telecommunications Union recently requested the submission of proposed methods for providing high rate data and high-quality speech services over wireless communication channels. A first of these proposals was issued by the Telecommunications Industry Association, entitled "The cdma2000 ITU-R RTT Candidate Submission" (hereafter cdma2000). In cdma2000, the equivalents of the Forward Traffic Channel in IS-95 are the Forward Fundamental Channel (F-FCH) and the Forward Dedicated Control Channel (F-DCCH). The data frames transmitted on these channels can be either 20 ms or 5 ms in duration. For F-FCH, a frame (20 or 5 ms) is transmitted in every 20 ms interval aligned to the beginning of the CDMA System Time. For F-DCCH, the transmission can be discontinuous, such that there may not be any data frame transmitted in a 20 ms interval aligned to the CDMA System Time.

The use of code division multiple access (CDMA) modulation techniques is one of several techniques for facilitating communications in which a large number of system users are present. Other multiple access communication system techniques, such as time division multiple access (TDMA) and frequency division multiple access (FDMA) are known in the art. However, the spread spectrum modulation technique of CDMA has significant advantages over these modulation techniques for multiple access communication systems. The use of CDMA techniques in multiple access communication systems is disclosed in U.S. Pat. No. 4,901,307, entitled "SPREAD SPECTRUM MULTIPLE ACCESS COMMUNICATION SYSTEM USING SATELLITE OR TERRESTRIAL REPEATERS," and U.S. Pat. No. 5,103,459, entitled "SYSTEM AND METHOD FOR GENERATING SIGNAL WAVEFORMS IN A CDMA CELLULAR TELEPHONE SYSTEM," both of which are assigned to the assignee of the present invention and incorporated by reference herein.

CDMA by its inherent nature of being a wideband signal offers a form of frequency diversity by spreading the signal energy over a wide bandwidth. Therefore, frequency selective fading affects only a small part of the CDMA signal bandwidth. Space or path diversity is obtained by providing multiple signal paths through simultaneous links from a mobile user through two or more cell-sites. Furthermore, path diversity may be obtained by exploiting the multipath environment through spread spectrum processing by allowing a signal arriving with different propagation delays to be received and processed separately. Examples of path diversity are illustrated in U.S. Pat. No. 5,101,501 entitled "METHOD AND SYSTEM FOR PROVIDING A SOFT HANDOFF IN COMMUNICATIONS IN A CDMA CELLULAR TELEPHONE SYSTEM," and U.S. Pat. No. 5,109,390 entitled "DIVERSITY RECEIVER IN A CDMA CELLULAR TELEPHONE SYSTEM," both assigned to the assignee of the present invention and incorporated by reference herein.

In a communication system that provides data using a Quadrature Phase-Shift Keying (QPSK) modulation format, useful information can be obtained by taking the cross product of the I and Q components of the QPSK signal. By knowing the relative phases of the two components, one can determine roughly the velocity of the mobile station in relation to the base station. A description of a circuit for determining the cross product of the I and Q components in a QPSK modulation communication system is disclosed in U.S. Pat. No. 5,506,865, entitled "PILOT CARRIER DOT PRODUCT CIRCUIT," assigned to the assignee of the present invention, the disclosure of which is incorporated by reference herein.

There has been an increasing demand for wireless communications systems to be able to transmit digital information at high rates. One method for sending high rate digital data from a remote station to a central base station is to allow the remote station to send the data using spread spectrum techniques of CDMA, such as that proposed in U.S. patent Ser. No. 08/886,604, entitled "HIGH DATA RATE CDMA WIRELESS COMMUNICATION SYSTEM," assigned to the assignee of the present invention and incorporated by reference herein.

New methods for supervising the F-DCCH are needed when F-DCCH is in this discontinuous transmission (DTX) mode because the mobile station must now decide whether a received frame is a good frame, a bad frame, or an empty frame (i.e., no transmission), and how to handle the transmission based upon the type of frames received.

SUMMARY OF THE INVENTION

The present invention is a method and apparatus for supervising a dedicated control channel used in a wireless communication system. The invention solves a variety of F-DCCH supervision problems when an empty frame is encountered.

A first embodiment is an improvement upon the methods used in IS-95, where empty frames are simply ignored. The mobile station maintains a counter of consecutive bad frames, COUNT1 (CNT1), a counter of consecutive good frames, COUNT2 (CNT2), and a counter of empty frames, COUNT3 (CNT3). Each of the COUNTs (CNTs) is set to zero at the beginning of a call. For each frame received, the mobile station determines if it is a good frame, a bad frame, or an empty frame. If the received frame is a good frame, CNT1 and CNT3 are reset to zero and CNT2 is incremented by 1. If the received frame is a bad frame, CNT1 is incremented by one and CNT2 is reset to zero. If CNT1 reaches a first threshold value, TH1, the mobile station disables its transmitter. If CNT2 reaches a second threshold value, TH2, the mobile station re-enables its transmitter. The mobile station resets its fade timer to X seconds whenever CNT2 reaches a third threshold value, TH3.

If the received frame is an empty frame, CNT1 and CNT 2 are unchanged, but CNT 3 is incremented by one. If CNT3 reaches a fourth threshold value, TH4, the mobile station disables its transmitter. If CNT3 reaches a fifth threshold value, TH5, the mobile station disables its transmitter, if not already disabled, and declares the Forward Traffic Channel as lost.

In another embodiment, the mobile station uses the received pilot strength (Ec/Io) of pilots in the Active Set to perform F-DCCH supervision. The method aggregates the Ec/Io of all pilots in the Active Set and averages them over a designated time interval. If this average aggregated value (AAV) is below a threshold for a specified amount of time, then the mobile station disables its transmitter. If the AAV continues below the threshold for a longer specified period of time, then the mobile station disables its transmitter, if not already disabled, and declares the Forward Traffic Channel as lost.

As readily recognizable to one skilled in the art, the invention also provides a number of advantages and benefits that will become apparent after reviewing the following description of the invention.

BRIEF DESCRIPTION OF THE DRAWINGS

Some of the features, objects, and advantages of the present invention are set forth in the detailed description below and when taken in conjunction with the drawings in which like reference characters identify correspondingly throughout, and wherein.

DETAILED DESCRIPTION OF VARIOUS EMBODIMENTS

Figure 1:
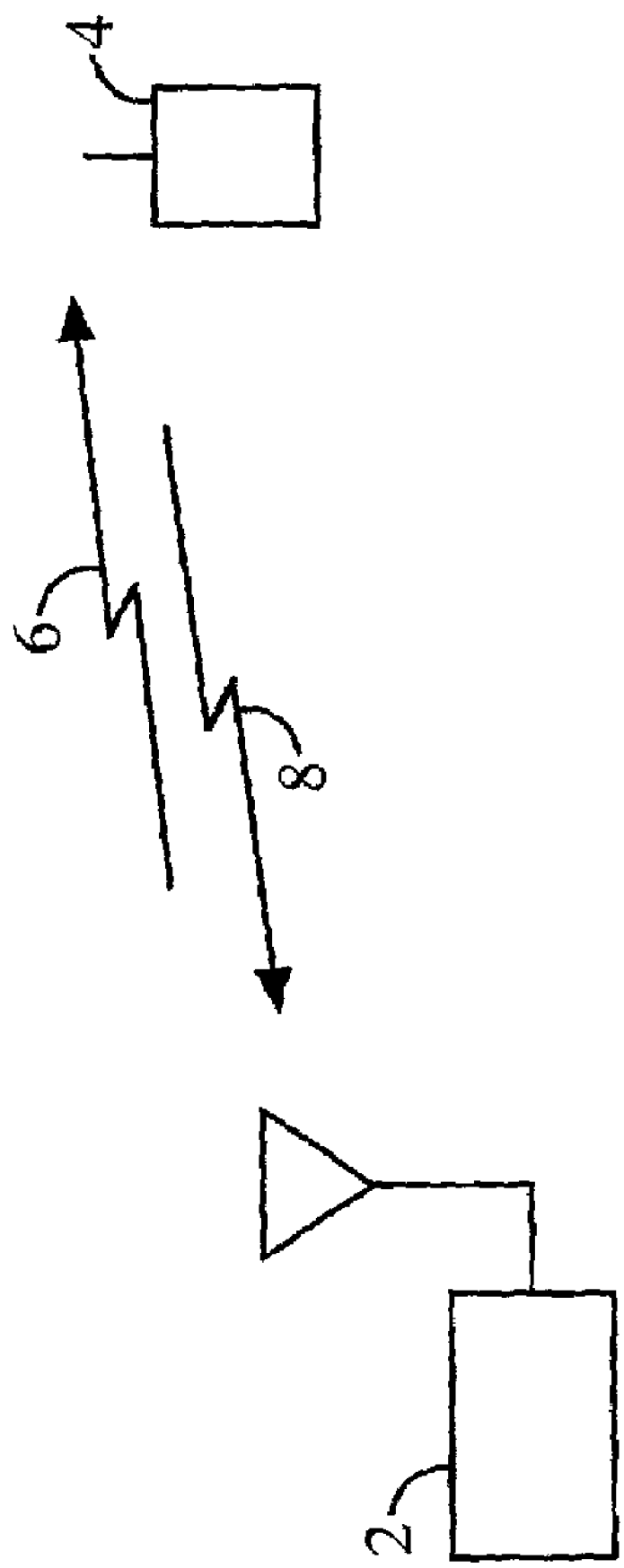
FIG. 1 is a diagram illustrating the elements of a wireless communications system.

In FIG. 1, base station 2 transmits forward link signal 6 to mobile station 4. Mobile station 4 transmits reverse link signal 8 to base station 2. In the exemplary embodiment, forward link signal 6 and reverse link signal 8 are code division multiple access (CDMA) communications signals as contemplated by the Telecommunications Industry Association in the candidate submission to the International Telecommunications Union (ITU) entitled "The cdma2000 ITU-R RTT Candidate Submission," and which has been further refined in the Interim Standard Draft Text entitled "Proposed Ballot Text for cdma2000 Physical Layer."

Figure 2:
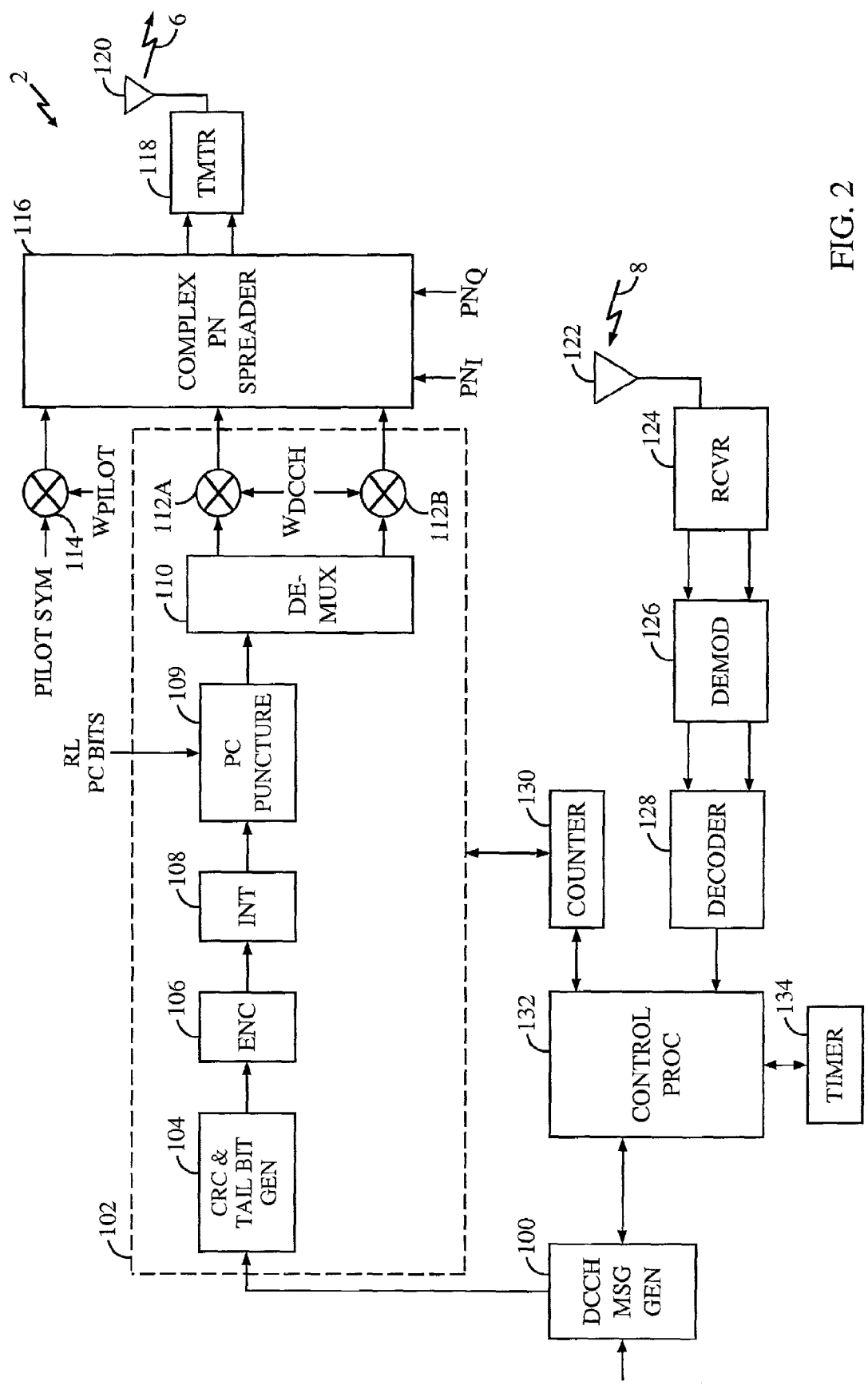
FIG. 2 is a block diagram of the base station of the present invention.

Turning to FIG. 2, the elements necessary for the transmission of the F-DCCH on forward link signal 6 and for reception of reverse link signal 8 is illustrated in greater detail. Messages for transmission on the F-DCCH are generated in F-DCCH message generator (DCCH MSG GEN) 100. These messages may include rate scheduling messages, handoff direction messages, and response messages as discussed below. The F-DCCH is a DTX channel that is transmitted when there is a message or messages to be communicated from a base station 2 to the mobile station 4.

A message is provided to F-DCCH processing element 102. F-DCCH processing element 102 performs the necessary pre-processing and encoding of the F-DCCH message and channelizes the message for transmission on the F-DCCH of forward link signal 6. The F-DCCH message is provided to cyclic redundancy check (CRC) and tail bit generator 104. In response, CRC and tail bit generator 104 generates a set of CRC bits in accordance with the bits in the F-DCCH message and appends the CRC bits to the F-DCCH message. CRC and tail bit generator 104 then appends a series of tail bits to clear the memory of a decoder at the receiver and provides the resulting packet to encoder 106.

In the exemplary embodiment, encoder 106 is a convolutional encoder, the design and implementation of which is well known in the art. However, the present invention is equally applicable to other types of encoders, such as block encoders and turbo encoders. The encoded symbols are provided to interleaver 108. Interleaver 108 reorders the symbols in a predetermined fashion in order to provide time diversity into the transmission of the F-DCCH message. The interleaving operation helps to spread the results of an error burst over the packet in order to improve the performance of the decoder at the receiver. These "error bursts"—bit or symbol errors that occur consecutively are typical in wireless communications systems.

The interleaved symbols are provided to power control puncturing element 109. Puncturing element 109 receives reverse link power control bits and punctures the power control bits into the interleaved symbol stream. The power control bits are transmitted to mobile station 4 and are used to adjust the transmission energy of reverse link signal 8.

The symbols from puncturing element 109 are provided to de-multiplexer 110 that alternatively outputs the symbols onto different processing paths. The first output of de-multiplexer 110 is provided to spreading element 112A and the next output of de-multiplexer 110 is provided to spreader 112B, and so on. Spreaders 112 spread the de-multiplexed symbols in accordance with an orthogonal spreading function WDCCH. Orthogonal spreading is well known in the art and a preferred embodiment of spreaders 112 is disclosed in the aforementioned U.S. Pat. No. 5,103,459. The spread signals are provided to complex PN spreader 116.

In addition to the dedicated control channel, base station 2 transmits a pilot channel to allow remote station 4 to coherently demodulate the received F-DCCH. Pilot symbols, typically an all-ones sequence, are provided to spreading element 114. The pilot symbols are spread in accordance with orthogonal spreading sequence $W_{pilot}$, which is orthogonal to spreading sequence $W_{DCCH}$.

The spread signals from spreading elements 112 and 114 are provided to complex PN spreader 116. Complex PN spreader 116 spreads the signals from spreaders 112 and 114 in accordance with two pseudonoise (PN) sequences PNI and PNQ. Complex PN spreading is well known in the art and is described in detail in the cdma2000 candidate submission, the IS-2000 draft specification and the aforementioned co-pending U.S. patent application Ser. No. 08/856,428. The complex PN spread signal is provided to transmitter (TMTR) 118. TMTR 118 up-converts, amplifies, and filters the spread signals for transmission through antenna 120 as forward link signal 6. In the exemplary embodiment, TMTR 118 modulates the signal in accordance with a QPSK modulation format.

Figure 3:
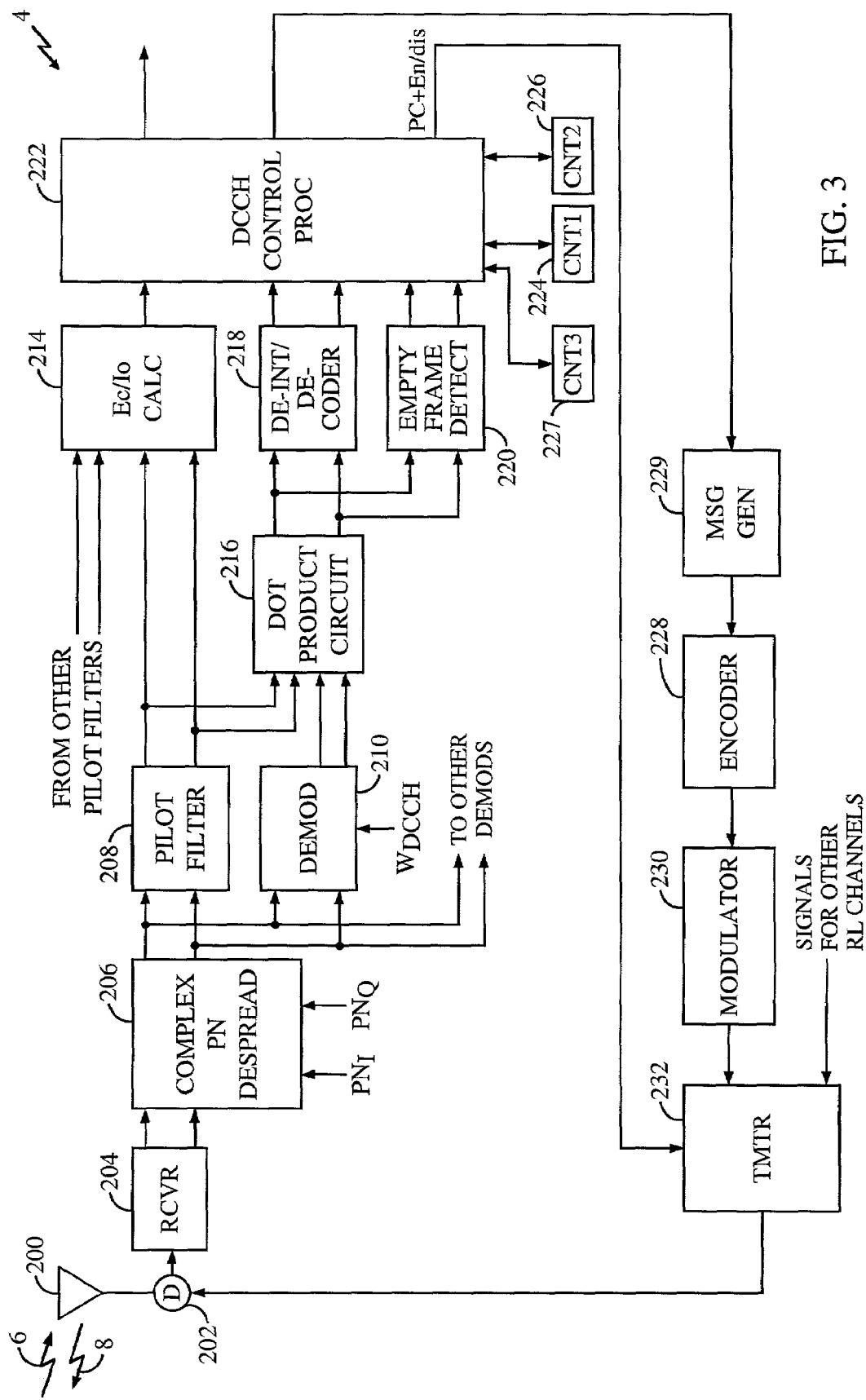
FIG. 3 is a block diagram of the remote station of the present invention.

Turning to FIG. 3, forward link signal 6 is received at antenna 200 and provided through duplexer 202 to receiver (RCVR) 204. RCVR 204 down-converts, amplifies, and filters forward link signal 6. RCVR 204 demodulates forward link signal 6 in accordance with a QPSK demodulation format and outputs the in-phase and quadrature-phase signals to complex PN despreader 206. Complex PN despreader 206 despreads the received signal in accordance with the two pseudonoise sequences used to spread the signal ($PN_I$ and $PN_Q$). The despread complex PN signals are provided to pilot filter 208. Pilot filter 208 further despreads the signal in accordance with the orthogonal spreading sequence $W_{pilot}$. The despread pilot symbols are provided to Ec/Io calculator 214 and dot product circuit 216.

The complex PN despread signals are also provided to demodulator 210. Demodulator 210 demodulates the PN despread signals in accordance with the orthogonal spreading code WDCCH. The despread signals are then provided to dot product circuit 216. Dot product circuit 216 computes the dot product of the F-DCCH and the pilot channel. Because both the pilot channel and dedicated control channel traverse the same propagation path, they will experience the same phase shifts. By computing the dot product of the pilot and DCCH channels, the result is a scalar set of magnitudes with the channel induced phase ambiguities removed. A preferred implementation of dot product circuit 216 is described in the aforementioned U.S. Pat. No. 5,506,865.

The resultant demodulated symbols from dot product circuit 216 are provided to de-interleaver/decoder 218 and empty frame detector 220. De-interleaver/decoder 218 de-interleaves and decodes the F-DCCH message and provides an estimate of the message or a signal indicating the declaration of a bad frame to DCCH control processor 222. There are a number of ways that a bad frame can be detected. A first is to determine whether the CRC, when generated locally at remote station 4, checks with the decoded CRC bits. A second is to compute the symbol error rate of the received symbols by comparing the received encoded symbols with a set of locally generated re-encoded symbols based on the decoded bits.

The demodulated symbols from dot product circuit 216 are also provided to empty frame detector 220. Empty frame detector 220 computes the signal to noise ratio of the demodulated symbols and compares the measured signal to noise ratio to a threshold. If the signal-to-noise-ration is below the threshold, an empty frame is declared. It should be noted that there are other methods of determining an empty frame, any of which may be employed without leaving the scope of the present invention. A method and apparatus for detecting empty frames is disclosed in U.S. Pat. No. 6,347,080, entitled "ENERGY BASED COMMUNICATION RATE DETECTION SYSTEM AND METHOD," assigned to the assignee of the present invention and incorporated by reference herein.

Data frames that are not empty are provided to DCCH control processor 222, which extracts the punctured power control commands and sends a signal to transmitter 232 adjusting the transmission energy of reverse link signal 8 in response. The loss of this power control command stream results in an inability to control the power of reverse link signal 8, which in turn increases the potential for jamming the reverse link.

In a first embodiment of the present invention, the DCCH control processor 222 receives an indication from de-interleaver decoder 218 or empty frame detector 220 that a frame is either good, bad, or empty. Three counters: CNT1 224, CNT2 226, and CNT3 227, are initialized to zero at the beginning of a call. If the received frame is a good frame, then CNT1 224 is reset to zero and CNT2 226 is incremented by one. If the received frame is declared a bad frame, then CNT1 224 is incremented and CNT2 226 is reset to zero. If the frame is declared empty, then values of CNT1 224 and CNT2 226 remain unchanged, and the value of CNT3 226 is incremented. If the value of CNT1 224 reaches a threshold TH1 then DCCH control processor 222 sends a signal to transmitter 232 disabling the transmitter (i.e., output power is turned off). Thereafter, if the value of CNT2 226 reaches a threshold TH2, then DCCH control processor 222 sends a signal to transmitter 232 re-enabling the transmitter. Similarly, if the value of CNT3 227 reaches a threshold TH4, then DCCH control processor 222 sends a signal to transmitter 232 disabling the transmitter. If the value of CNT3 227 reaches a threshold TH5, then DCCH control processor 222 sends a signal to transmitter 232 disabling the transmitter, if not already disabled, and declares a loss of the Forward Traffic Channel (i.e., terminate the call.)

In a second embodiment, base station 2 transmits a frame, referred to herein as a supervisory frame, every N-second interval, if there is no data frame to be transmitted on the F-DCCH at that time. The supervisory frame contains predefined bits known to the mobile station and is transmitted at the lowest data rate that has been negotiated between base station 2 and mobile station 4. Referring to FIG. 2, timer 134 tracks the N-second intervals and at the expiration of the interval sends a signal to control processor 132. Control processor 132 determines whether there is a message for transmission and if not provides a signal to message generator 100 to generate a supervisory frame and to a counter 130 which controls the N-second interval for the supervisory frame transmission. The supervisory frame is transmitted on the F-DCCH channel as described with respect to other DCCH messages previously. Mobile station 4 then performs F-DCCH supervision on non-empty frames transmitted at such preset time in a way similar to that defined in IS-95, with potentially different values for various thresholds. Mobile station 4 may also include other non-empty frames received for supervision purpose in addition to these periodic frames. In another embodiment, the mobile station knows that a supervisory frame is transmitted every N-seconds. If a good frame is not received within N-seconds, CNT1 is incremented. This method may be used in conjunction with the first embodiment discussed above.

In a third embodiment, base station 2 transmits a frame, referred to herein as a supervisory frame, whenever the number of consecutive empty frames exceeds a threshold. In a preferred embodiment, the supervisory frame contains predefined bits known to the mobile station and is transmitted at the lowest data rate that has been negotiated between base station 2 and mobile station 4. Referring to FIG. 2, control processor 132 tracks the number of consecutive empty frames in accordance with signals from message generator 100. When the number of consecutive empty frames exceeds the threshold values, then control processor 132 sends a signal to issue a supervisory frame to message generator 100 to generate the supervisory frame and to a counter 130, which controls the N-second interval for the supervisory frame transmission. The supervisory frame is transmitted on the F-DCCH channel as described with respect to other F-DCCH messages. Mobile station 4 then performs F-DCCH supervision on all non-empty frames in a way similar to that defined in IS-95, with potentially different value for various thresholds. In another embodiment, control processor 132 tracks the number of consecutive empty frames in a given time interval N. If a good frame is not received within the time interval N, then CNT1 is incremented and the invention proceeds as discussed above.

In a fourth exemplary embodiment, mobile station 4 transmits a request message that requires reply from base station 2 when the number of consecutive empty frames detected exceeds a threshold. The reply can simply be an acknowledgement that the request message was received. Referring to FIG. 3, control processor 222 receives an indication as to whether a frame is empty from empty frame detector 220. In this embodiment, CNT1 224 tracks the number of consecutive empty frame and is reset when a bad frame or good frame is detected. When the count of consecutive empty frames exceeds a threshold, control processor 222 sends a signal to message generator (MSG GEN) 229, which in response generates the request message. The request message is encoded in encoder 228, modulated in modulator 230, and up-converted, amplified and filtered onto a predetermined channel of reverse link signal 8. The request message can be any existing message that is already defined in the standard, which does not cause any base station action besides sending an acknowledgement. For example, the Power Measurement Report Message. The request message can also be a special message that causes the base station 2 to transmit a supervisory frame on the F-DCCH.

Turning to FIG. 2, the request message is received on antenna 122 and provided to receiver 124 which down-converts, amplifies and filters reverse link signal 8 and provides the received signal to demodulator 126. Demodulator 126 demodulates the signal and decoder 128 decodes the demodulated symbols providing the request message to control processor 132. In response, control processor 132 determines if a message is queued to be transmitted on the F-DCCH and if not sends a signal requesting that message generator 100 generates a message for transmission on the F-DCCH. In the exemplary embodiment, the message generated by generator 100 is simply an acknowledgement of the receipt of the request message from mobile station 4.

The mobile station knows that the base station will reply. Therefore, in another embodiment, if the mobile station does not receive a good frame within an interval of T seconds after the request message is sent, CNT1 is incremented and the invention proceeds as discussed above. In another version, the mobile station contains an acknowledgement counter that counts the number of times the mobile station attempts to transmit the request message. If a response from the base station is not received within K number of attempts, the mobile station disables its transmitter, if it is not already disabled, and declares a loss of the Forward Traffic Channel (i.e., the call is terminated).

In a fifth embodiment, mobile station 4 transmits a request message which requires a reply from base station 2 when the number of empty frames detected within a predetermined number of received frames exceeds a threshold, regardless of whether or not the empty frames are consecutive. Referring to FIG. 3, control processor 222 receives an indication as to whether a frame is empty from empty frame detector 220. CNT1 224 tracks the number of empty frames in a moving accumulator fashion. When the count of empty frames in a predetermined number of received frames exceeds a threshold, control processor 222 sends a signal to message generator (MSG GEN) 229, which in response generates a request message. The request message is encoded in encoder 228, modulated in modulator 230, and up-converted, amplified and filtered onto a predetermined channel of reverse link signal 8.

Turning to FIG. 2, the request message is received on antenna 122 and provided to receiver 124 which down-converts, amplifies and filters reverse link signal 8 and provides the received signal to demodulator 126. Demodulator 126 demodulates the signal, and decoder 128 decodes the demodulated symbols providing the request message to control processor 132. In response, control processor 132 determines if a message is queued to be transmitted on the F-DCCH and if not sends a signal requesting that message generator 100 generates a message for transmission on the F-DCCH. In the exemplary embodiment, the message generated by generator 100 is simply an acknowledgement of the receipt of the request message.

The mobile station knows that the base station will reply. If a reply is not received within T seconds after sending the message, then CNT1 is incremented. In another embodiment, the mobile station contains an acknowledgement counter that counts the number of times the mobile station attempts to transmit the request message. If a reply is not received after K attempts at sending the message, the mobile station disables its transmitter, if it is not already disabled, and declares a loss of the Forward Traffic Channel (i.e., the call is terminated).

In a sixth embodiment, mobile station 4 uses the received pilot strength (Ec/Io) of pilots in the Active Set to perform F-DCCH supervision. If the aggregated Active Set pilot Ec/Io is above a preset threshold, mobile station 4 considers the data, if sent in that frame, will be received correctly—therefore, a good frame. Otherwise, mobile station 4 considers the frame as bad. A supervision rule with the above definition of good frame and bad frame similar to that specified in IS-95 can then be used, with either the same thresholds or modified ones.

Referring to FIG. 3, the signal to noise ratio (Ec/Io) of the received pilot symbols is computed in Ec/Io calculator 214. The Ec/Io value for the pilot signal of forward link signal 6 is combined with the Ec/Io value of pilots from other base stations in the Active Set of mobile station 4 to provide an aggregate Ec/Io. The Active Set of base stations is the set of base stations currently communicating with mobile station 4. The aggregate pilot Ec/Io is provided to control processor 222 that compares the aggregate Ec/Io to a threshold value. If the aggregate Ec/Io exceeds a threshold, a good frame is declared; and if the aggregate Ec/Io is less than the threshold, a bad frame is declared. This allows mobile station 4 to infer a received frame, if non-empty, is a good frame or a bad frame without decoding the frame. Based on these counts, mobile station 4 will enable or disable transmitter 232 as described previously.

In another embodiment, the aggregated Ec/Io is averaged over certain specified time intervals. If the average aggregated Ec/Io is below a threshold THx for a first time period (for example, 220 ms), then the mobile station will disable its transmitter. Thereafter, if the average aggregated Ec/Io is above a threshold THx for a second time period (for example, 40 ms), then the mobile station will re-enable its transmitter. However, if the average aggravated pilot Ec/Io remains below the threshold THx for a much longer third time period (for example, 5 seconds), then the mobile station will disable its transmitter, if not already disabled, and declare a loss of the Forward Traffic Channel (i.e., terminate the call.) Although suggested lengths for the time periods are given, the time periods are adaptive, and may be longer or shorter in duration depending upon the application.

The previous description of the various embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A method for supervising transmissions from a remote station comprising:
   measuring signal-to-noise ratios of received transmissions;
   determining if a frame is good or bad based on an average signal-to-noise ratio over a first time interval, the average signal-to-noise ratio ascertained by averaging a plurality of aggregated signal-to-noise ratios corresponding to pilot signals received from each of a plurality of base stations in an active set over the first time interval; and
   discontinuing transmission of a reverse link as a function of whether said average signal-to-noise ratio is below a first threshold for a second time interval.

2. A method for supervising transmissions from a remote station comprising:
   measuring signal quality of received transmissions;
   determining if a frame is good or bad based on an average for a signal quality measurement over a first time interval;
   determining an aggregate of said signal quality for a plurality of received transmission, wherein determining the average comprises determining an average for said aggregate over the first time interval; and
   discontinuing transmission of a reverse link if said average for said aggregate is below a first threshold for a second time interval ($T_1$).

3. The method recited in claim 2, further comprising:
   determining a loss of forward link channel if said average is below said first threshold for a third time interval ($T_2$), wherein $T_2 > T_1$.

4. The method recited in claim 2, wherein the signal is a pilot signal.

5. The method recited in claim 2, wherein measuring the signal quality comprises:
   measuring signal strength.

6. The method recited in claim 5, wherein measuring signal comprises:
   calculating a ratio of signal strength (Ec) to noise floor (Io), as Ec/Io.

7. An apparatus for supervising transmissions from a remote station comprising:
   means for measuring signal-to-noise ratios of received transmissions;
   means for determining if a frame is good or bad based on an average signal-to-noise ratio over a first time interval, the average signal-to-noise ratio ascertained by averaging a plurality of aggregated signal-to-noise ratios corresponding to pilot signals received from each of a plurality of base stations in an active set over the first time interval; and
   means for discontinuing transmission of a reverse link as a function of whether said average signal-to-noise ratio is below a first threshold for a second time interval.

8. An apparatus for supervising transmissions from a remote station comprising:
   means for measuring signal quality of received transmissions;
   means for determining if a frame is good or bad based on an average for said signal quality measurement over a first time interval;
   means for determining an aggregate of said signal quality for a plurality of received transmissions, wherein determining the average comprises means for determining an average for said aggregate over the first time interval; and
   means for discontinuing transmission of a reverse link if said average for said aggregate is below a first threshold for a second time interval ($T_1$).

9. The apparatus recited in claim 8, further comprising: means for determining a loss of forward link channel if said average is below said first threshold for a third time interval ($T_2$), wherein $T_2 > T_1$.

10. The apparatus recited in claim 8, wherein the signal is a pilot signal.

11. The apparatus recited in claim 8, wherein measuring the signal quality comprises:
    means for measuring signal strength.

12. The apparatus as in claim 11, wherein measuring signal comprises:
    means for calculating a ratio of signal strength (Ec) to noise floor (Io), as Ec/Io.

13. A method for supervising transmissions from a remote station comprising:
    measuring signal quality of received transmissions based on aggregating a plurality of signal-to-noise ratios, the plurality of signal-to-noise ratios corresponding to pilot signals received from each of a plurality of base stations in an active set;
    determining if a received frame of the received transmissions is a bad frame based on the signal quality;
    counting a number of bad frames;
    determining if a received frame of the received transmissions is a good frame based on the signal quality;
    counting a number of good frames;
    resetting the number of bad frames to a new value when the received frame is a good frame; and
    disabling a transmitter from transmitting a reverse link when the number of bad frames exceeds a bad frame limit.

14. An apparatus for supervising transmissions from a remote station comprising:
    means for measuring signal quality of received transmissions based on aggregating a plurality of signal-to-noise ratios, the plurality of signal-to-noise ratios corresponding to pilot signals received from each of a plurality of base stations in an active set;

means for determining if a received frame of the received transmissions is a bad frame based on the signal quality;

means for counting a number of bad frames;

means for determining if a received frame of the received transmissions is a good frame based on the signal quality;

means for counting a number of good frames;

means for resetting the number of bad frames to a new value when the received frame is a good frame; and means for disabling a transmitter from transmitting a reverse link when the number of bad frames exceeds a bad frame limit.

15. A processing unit for supervising transmissions from a remote station comprising:

means for measuring signal quality of received transmissions;

means for determining if a frame is good or bad based on an average for said signal quality measurement over a first time interval;

means for determining an aggregate of said signal quality for a plurality of received transmission, wherein the means for determining the average comprises means for determining an average of said signal quality measurement for said aggregate of said signal quality over the first time interval; and means for discontinuing transmission of a reverse link if said average of said signal quality measurement for said aggregate is below a first threshold for a second time interval ($T_1$).

16. A processing unit as recited in claim 15, further comprising:

means for determining a loss of forward link channel if said average is below said first threshold for a third time interval ($T_2$), wherein $T_2 > T_1$.

17. The processing unit recited in claim 15, wherein the signal is a pilot signal.

18. The processing unit recited in claim 15, wherein the means for measuring the signal quality comprises:

means for measuring signal strength.

19. The processing unit recited in claim 18, wherein the means for measuring the signal quality comprises;

means for calculating a ratio of signal strength ($E_c$) to noise floor ($I_o$), as $E_c/I_o$.

20. A processing unit as recited in claim 15, further comprising:

means for reestablishing transmissions if said average is above said first threshold for a third time interval ($T_2$), wherein $T_2 > T_1$.

21. An apparatus comprising:

a receiver configured to receive a data signal and a plurality of pilot signals, the plurality of pilot signals respectively received from each of a plurality of base stations in an active set;

a decoder configured to decode the data signal to determine whether a bad frame or a good frame has been received in the data signal based on an aggregated signal-to-noise ratio, the aggregated signal-to-noise ratio ascertained by aggregating signal-to-noise ratios corresponding to each of the plurality of pilot signals;

a control processor configured to receive an indication from the decoder, the indication indicating whether a bad frame or a good frame has been received, wherein the control processor counts the number of bad frames and good frames; and a transmitter configured to transmit an output signal, wherein the control processor is configured to disable the transmitter as a function of the indication from the decoder.

22. The apparatus of claim 21, wherein the control processor is configured to disable the transmitter if the number of bad frames based on the aggregated signal-to-noise ratio reaches a first threshold.

23. The apparatus of claim 22, wherein the control processor is configured to re-enable the transmitter if the number of good frames based on the aggregated signal-to-noise ratio reaches a second threshold.

24. The apparatus of claim 21, further comprising:

a first counter configured to store the number of bad frames; and a second counter configured to store the number of good frames.

25. A computer program product, comprising:

a non-transitory computer-readable medium comprising:

code for causing at least one computer to measure signal-to-noise ratios of received transmissions;

code for causing at least one computer to determine if a frame is good or bad based on an average signal-to-noise ratio over a first time interval, the average signal-to-noise ratio ascertained by averaging a plurality of aggregated signal-to-noise ratios corresponding to pilot signals received from each of a plurality of base stations in an active set over the first time interval; and code for causing at least one computer to discontinue transmission of a reverse link as a function of whether said average signal-to-noise ratio is below a first threshold for a second time interval.

* * * * *